United States Patent
Tshagharyan et al.

(10) Patent No.: US 10,115,477 B2
(45) Date of Patent: Oct. 30, 2018

(54) FINFET-BASED MEMORY TESTING USING MULTIPLE READ OPERATIONS

(71) Applicant: Synopsys, Inc., Mountain View, CA (US)

(72) Inventors: Grigor Tshagharyan, Yerevan (AM); Gurgen Harutyunyan, Yerevan (AM); Samvel Shoukourian, Yerevan (AM); Yervant Zorian, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/718,284

(22) Filed: Sep. 28, 2017

(65) Prior Publication Data

US 2018/0130546 A1    May 10, 2018

Related U.S. Application Data

(60) Provisional application No. 62/402,598, filed on Sep. 30, 2016.

(51) Int. Cl.
*G11C 8/00* (2006.01)
*G11C 29/38* (2006.01)
(Continued)

(52) U.S. Cl.
CPC .............. *G11C 29/38* (2013.01); *G11C 29/36* (2013.01); *H01L 27/0924* (2013.01);
(Continued)

(58) Field of Classification Search
CPC ..................................................... G11C 8/00
(Continued)

(56) References Cited

U.S. PATENT DOCUMENTS 6,847,582 B2 * 1/2005 Pan ................... H03K 19/00384
326/93
7,290,186 B1 10/2007 Zorian et al.
(Continued)

FOREIGN PATENT DOCUMENTS

CN        103337258 A    10/2013
CN        104361909 A    2/2015

OTHER PUBLICATIONS

Mrs. Princy.P et al. "A comparative study on march tests for SRAMS", AJER vol. 3, Issue 3, pp. 103-112, 2014.
(Continued)

*Primary Examiner* — Jason Lappas
(74) *Attorney, Agent, or Firm* — Bever, Hoffman & Harms, LLP

(57) ABSTRACT

A test methodologies for detecting both known and potentially unknown FinFET-specific faults by way of implementing an efficient and reliable base set of March elements in which multiple sequential March-type read operations are performed immediately after logic values (i.e., logic-0 or logic-1) are written into each FinFET cell of a memory array. For example, a March-type write-1 operation is performed, followed immediately by multiple sequentially-executed March-type read-1 operations, then a March-type write-0 operation is performed followed immediately by multiple sequentially-executed March-type read-0 operations. An optional additional March-type read-0 operation is performed before the March-type write-1 operation, and an optional additional March-type read-1 operation is performed before the March-type write-0 operation. The write-1-multiple-read-1 and write-0-multiple-read-0 sequences are performed using one or both of an increasing address order and a decreasing address order.

8 Claims, 7 Drawing Sheets

(51) Int. Cl.
  G11C 29/36  (2006.01)
  H01L 27/092  (2006.01)
  H01L 27/11  (2006.01)
  H01L 29/78  (2006.01)
  G11C 11/41  (2006.01)
(52) U.S. Cl.
  CPC ........ *H01L 27/1104* (2013.01); *H01L 29/785* (2013.01); *G11C 8/00* (2013.01); *G11C 11/41* (2013.01)
(58) Field of Classification Search
  USPC .......................................... 365/233, 189.05
  See application file for complete search history.

(56) References Cited

U.S. PATENT DOCUMENTS

| 8,042,011 B2 | 10/2011 | Nicolaidis et al. |
| 8,850,277 B2 | 9/2014 | Amirkhanyan et al. |
| 2009/0199057 A1 | 8/2009 | Al-Harbi et al. |
| 2010/0275074 A1 | 10/2010 | Nicolaidis et al. |
| 2013/0019130 A1 | 1/2013 | Hakhumyan et al. |
| 2013/0019132 A1 | 1/2013 | Amirkhanyan et al. |
| 2014/0380107 A1 | 12/2014 | Hakhumyan et al. |

OTHER PUBLICATIONS

G. A. Tshagharyan et al. "Built-In Test Flow for FinFET-based Memory Devices", vol. 115, No. 4, pp. 276-283, 2015.
S. Hamdioui et al. "Comparison of Static and Dynamic Faults in 65nm Memory Technology", Delft University of Technology, Computer Engineering Laboratory, pp. 1-6, (date unknown).
L. Dilillo et al. "Dynamic Read Destructive Faults in Embedded-SRAMs: Analysis and March Test Solution", Proceedings of the Ninth IEEE European Test Symposium, pp. 1-6, 2004.
S. Hamdioui et al. "Dynamic Faults in Random-Access-Memories Concept, Fault Models and Tests", Journal of Electronic Testing: Theory and Applications 19, pp. 195-205, 2003.
L. Dilillo et al. "Efficient March test Procedure for Dynamic Read Destructive Fault Detection in SRAM Memories", Journal of Electronic Testing, Springer Verlag, 2005, 21 (5), pp. 551-561.
L. Dilillo et al. "Efficient Test of Dynamic Read Destructive Faults in SRAM Memories", LATW: Latin American Test Workshop, Mar. 2005, Salvador, Bahia, Brazil. 6th IEEE Latin American Test Workshop, pp. 40-45 (2-7), 2005.
Nor Azura Zakaria et al. "Fault Detection With Optimum March Test Algorithm", Journal of Theoretical and Applied Information Technology, vol. 47, No. 1, pp. 18-27, 2013.
G. Harutyunyan et al. "Fault Modeling and Test Algorithm Creation Strategy for FinFET-Based Memories", IEEE 32nd VLSI Test Symposium, pp. 1-6, 2014.
A. Bosio et al. "March Test BDN: A New March Test for Dynamic Faults", CEAI, vol. 10, No. 2, pp. 3-9, 2008.
G. Harutyunyan et al. "Minimal March Tests for Detection of Dynamic Faults in Random Access Memories", Journal of Electronic Testing: Theory and Applications 23, 55-74, 2007.
G. Narahari et al. "Modeling and Simulation Experiment on a Buit-In SelfTest for Memory Fault Detection in SRAM", IJERT, vol. 1, Issue 7, pp. 1-8, Sep. 2012.
A. Benso et al. "March AB, March AB1: New March Tests for Unlikely Dynamic Memory Faults", International Test Conference, IEEE,Paper 33.3, pp. 1-8, 2005.
G. Harutyunyan et al. "Test and Repair Methodology for FinFET-Based Memories", IEEE Transactions on Device and Materials Reliability, vol. 15, No. 1, Mar. 2015.
S. Hamdioui et al. "Testing Static and Dynamic Faults in Random Access Memories", Proceedings of the 20th IEEE VLSI Test Symposium, pp. 1-6, 2002.

\* cited by examiner

FINFET-BASED MEMORY TESTING USING MULTIPLE READ OPERATIONS

RELATED APPLICATION

This application claims priority from U.S. Provisional Patent Application 62/402,598, entitled "BASIC TEST PATTERNS FOR FinFET-BASED MEMORIES", which was filed on Sep. 30, 2016, and is incorporated by reference herein.

FIELD OF THE INVENTION

This invention relates to testing electronic memories to identify and replace faulty memory cells in embedded memory arrays, and more particularly to modified testing algorithms optimized to identify dynamic faults in embedded FinFET-based memory arrays.

BACKGROUND OF THE INVENTION

Due to the ever increasing demand for cheaper, faster, more complex integrated circuit (IC) devices, IC manufacturers are replacing embedded memories based on standard planar transistor technologies with Fin Field Effect Transistor (FinFET) memories. The phrase "embedded memory" refers herein to on-chip (integrated) electronic memory devices that support a System-on-Chip (SoC) or other IC device's logic core (e.g., one or more microprocessors, a graphics processing unit (GPU), etc.). High-performance embedded memory arrays are a key component in modern SoC devices because their integration with the logic core on the same semiconductor (e.g., silicon) chip reduces both device sizes and data transfer delays, thereby facilitating lower manufacturing prices and higher processing speeds. Most conventional embedded memory arrays produced using well-established semiconductor fabrication technologies (e.g., with minimum features sizes of 28 nm or more) were implemented using planar static-random-access-memory (SRAM) technology, such as that shown and described below with reference to FIG. 12. In SoCs produced using more recently developed semiconductor fabrication technologies (e.g., those produced using semiconductor fabrication technologies with minimum features sizes of 22 nm or smaller) utilize embedded memories in which conventional planar SRAMs are replaced with FinFETs, such as those shown and described below with reference to FIGS. 13A and 13B. As explained below, FinFET architectures are better suited than planar SRAM architectures for smaller fabrication process feature sizes.

FIG. 12 shows a conventional planar SRAM cell in which a gate voltage applied to a doped polycrystalline silicon gate structure (Gate) controls channel current flow (indicated by the arrow from a source region (S) to a drain region(D)) through a channel region of a silicon substrate residing under the gate structure. The conventional planar SRAM architecture works well when the length of the channel under the gate (i.e., measured in the direction of the arrow in FIG. 10) is sufficiently large, but encounters short-channel effects when the channel is too short and too deep for the gate structure to control it properly, whereby a leakage current flows between the source and drain regions even when the gate is maintained at an "off" potential (i.e., the FET remains at least partially "on" at all times), which causes very high static power dissipation. This is the major process motivation for moving away from planar FET architectures as advances in semiconductor fabrication processes provide minimum features sizes of 22 nm and smaller.

FIGS. 13A and 13B show a single-fin FinFET cell and a multiple-fin FinFET cell, respectively. Referring to FIG. 13A, the single fin is formed by a thin silicon structure that extends upward from the silicon substrate and passes through the polycrystalline silicon gate structure (i.e., such that the gate material contacts both side and upper surfaces of the fin). The portion of the fin that passes through the gate structure forms the FinFET's channel. Because the channel is substantially entirely surrounded by the gate structure, current through the channel (indicated by the arrow) is well-controlled, and leakage is much lower than that experienced by planar SRAM FETs for a given channel length. The FinFET architecture also facilitates using two or more fins (e.g., three, as illustrated in FIG. 13B) to better control current flow at lower operating voltages, which enables FinFET embedded memories to function using lower operating voltages than those required by planar FET memories, which in turn reduces power consumption. Accordingly, as minimum features sizes move below 22 nm, FinFET cells have replaced SRAM FETs as the preferred embedded memory technology at least because of their lower leakage, but also because FinFETs are considered more power efficient than planar FETs.

Like any IP block-based circuit of a SoC or other fabricated IC device, all embedded memory arrays need to be tested before use. But unlike many other IP blocks that perform logic functions, memory testing does not involve a simple pass/fail process. Memories are typically designed with redundant rows and columns that can be used in place of faulty primary rows/columns having process-related defects, so memory testing typically involves identifying faulty primary rows/columns, and reconfiguring the embedded memory array's wiring to route data read/write commands addressed to a given faulty primary row/column into a designated redundant row/column. Due to the large amount of embedded memory utilized in modern SoCs, the ability test and replace faulty memory cells with redundant memory cells facilitates manufacturing yields of 90% or higher. However, knowing that memory defects can be fixed by way of utilizing the redundant rows/columns, SoC process designers are more likely to push the process node to the limit (e.g., utilize minimum fabrication process parameters to maximize throughput at the expense of increasing the chance of process-related memory cell defects/faults). Accordingly, memory test processes have become increasingly important to supplement the design-manufacturing process. Before understanding how to test and repair a given embedded memory array, memory test developers must understand the ways in which a faulty memory cell can fail. As used herein, the phrase "faulty memory cell" refers to a memory cell (e.g., a FinFET cell) exhibiting at least one static or dynamic fault that prevents the faulty memory cell from properly storing and retaining a bit value (i.e., either a logic-1 or a logic-0) under all operating conditions. Faulty memory cells are typically produced when localized fabrication process variances generate one or more cell elements (e.g., pull-up or pull-down transistors) that consistently or periodically fail, thereby causing the faulty memory cell to provide erroneous data during operation. Static faults are sensitized (i.e., undesirably affect the logical-0 or logical-1 value stored on the faulty memory cell) by a single read or write operation performed on a given faulty memory cell. An exemplary static fault is a Stuck-At Fault (SAF), wherein the logic state of the faulty memory cell remains constant even when subjected to opposing write operations (e.g., the faulty cell stores a logical-0 even when subjected to a logical-1 write operation). Other well-known static memory faults include Transition Faults (TF), Read Destructive Faults (RDF), Deceptive Read Destructive Faults (DRDF), State Coupling Faults (CFst), Read Destructive Coupling Faults (CFrd), Deceptive Read Destructive Coupling Faults (CFdrd), and Read Disturb Coupling Faults (CFdsr). In contrast to static faults, dynamic faults in faulty memory cell are sensitized by being subjected to a sequence of two or more read or write operations. An exemplary dynamic fault is a dynamic Read Destructive Faults (dRDF), wherein the faulty cell's logic state undesirably changes when subjected to multiple read operations (e.g., the faulty cell switches from logical-0 to logical-1 when subjected to multiple logical-0 read operations). Other well-known dynamic faults include dynamic Deceptive Read Destructive Faults (dDRDF) and dynamic Incorrect Read Faults (dIRF).

A built-in self-test (BIST) circuit is an on-chip diagnosis tool that tests embedded memory, for example, each time an SoC or other IC device is powered-up, periodically during operation, or in response to an external signal or condition. A typical BIST circuit includes a finite state machine (BIST-FSM), an address generator, a data generator, and a programmable test algorithm register (TAR) that are configured to access each associated embedded memory array using techniques known in the art. A BIST test algorithm is the test process executed by the BIST circuit, and typically comprises many elements, referred to as March elements. A March element includes a sequence of operations, for example write-0, write-1, read-0 and read-1, which are applied to each given memory cell before proceeding to a next memory cell. The March element also designates whether the operations proceed from memory cell to memory cell in an increasing order of addresses, or in a decreasing order of addresses, or in some other predefined order of addresses. A sequence of March elements is defined as a March test. As used herein, a notation that describes a given March test is defined as follows. A complete March test is delimited by a '{ . . . }' parenthesis pair whereas a March element is delimited by a '( . . . )' parenthesis pair. A given March element can include a plurality of following operations, with notations as indicated: increase address order notated by '⇑', and decrease address order notated by '⇓'. Write logical 0 (write-0), write logical 1 (write-1), read logical 0 (read-0) and read logical 1 (read-1) are notated respectively by 'W0', 'W1', 'R0' and 'R1'. As an example of notation, the March test {⇑(W0), ⇑(R0,W1), ⇓(R1,W0)} instructs to write-0 to memory addresses in an increasing address order sequence, then also in the increasing order of addresses read-0 and write-1, and finally in the decreasing order of addresses read-1 and write-0. The BIST circuit TAR holds information relating to the March elements performed by a given memory test algorithm, namely an addressing direction, an addressing type, an operation code (that is, a sequence of read or write operations to be applied to each memory cell) and a pattern type (that is, a code that represents data to be written to the memory cells). Upon triggering of the BIST, the BIST-FSM of the apparatus reads data from the TAR, and thereby selects the addressing direction, the addressing type, the code corresponding to the background data pattern, and the sequence of read or write operations. Based on the pattern type, the data generator generates the test data. Based upon the addressing direction and the addressing type, the address generator selects the memory cell to be tested. Based upon the operation code, the test data is applied to the memory cell to be tested.

The combination of FinFET's unique structure and the evolving fabrication processes currently being developed for each new generation of smaller-feature FinFETs (e.g., 16 nm, 14 nm, 10 nm and 7 nm) provides room for new fault types in FinFET-based memories that may not be anticipated, and therefore not detected by the existing test algorithms used for testing planar-based memories.

What is needed is a testing methodology that reliably detects a wide range of dynamic faults arising in FinFET-based memory arrays. What is particularly needed is a scalable testing method that can be easily modified to detect new dynamic faults that may arise as FinFET cells are fabricated using ever-smaller fabrication process feature sizes.

SUMMARY OF THE INVENTION

The present invention is directed to test methodologies for detecting both known and potentially unknown FinFET-specific faults by way of implementing an efficient and reliable base set of March elements in which multiple (i.e., at least three) sequential March-type read operations are performed immediately after logic values (i.e., logic-0 or logic-1) are written into each FinFET cell of a memory array. For example, a novel test methodology might include a March-type write-1 operation followed immediately by (i.e., such that no intervening March-type elements are performed) multiple sequentially-executed March-type read-1 operations, and a March-type write-0 operation followed immediately by multiple sequentially-executed March-type read-0 operations. Alternatively, the order of the write/read operations may be reversed (i.e., the write-0-multiple-read-0 sequence may be performed before the write-1-multiple-read-1 sequence), and additional March-type tests may be included before, between and after the two sequences. It was determined experimentally that, due to the construction and configuration of FinFET cells fabricated using known process technologies, certain dynamic FinFET memory faults generate data errors when the same logic value (i.e., either logic-1 or logic-0) is read multiple times consecutively. For example, a first FinFET cell in a memory array may contain a particular fault that is sensitized when the first FinFET cell is subjected to a sequence of three or more consecutive read-0 operations, but the same faulty first FinFET cell may be subjected to any number of consecutive read-1 operations without error. It was discovered that, due to the symmetrical configuration utilized in FinFET memory arrays, process flaws that cause dynamic (e.g., multiple-read-0) errors in one or more first FinFETs typically can cause mirror-image dynamic (i.e., multiple-read-1) errors in one or more second FinFET cells of the memory array. Accordingly, by performing the base set of test patterns (i.e., at least one multiple-read-1 sequence and at least one multiple-read-0 sequence) on each FinFET cell of a FinFET-based memory array, the present invention facilitates reliable and efficient test methodologies capable of detecting faulty FinFET cells caused by a wide range of FinFET-specific (e.g., symmetric dynamic) faults. These faults are specific to FinFETs, and may arise in future FinFET configurations too, as fabrication process feature sizes continue to decrease.

In a presently preferred embodiment, eight or more March-type read-1 or read-0 operations are performed during each multiple sequential March-type read operation sequence. FinFETs produced using various fabrication processes (e.g., 22 nm, 16 nm, etc.) were analyzed, and it was found that all multiple-read-type dynamic faults in FinFETs fabricated using larger-feature-size processes occurred within eight consecutive read operations. However, when moving from FinFETs fabricated using 16 nm/10 nm to FinFETs fabricated using smaller (e.g., 7 nm) features sizes, it was noticed that the required number of consecutive read operations necessary to sensitize FinFET-specific faults increased above eight. Accordingly, it is an aspect of the invention that at least eight consecutive read operations are performed during each multiple-read-1 sequence and during each multiple-read-0 sequence, and it is recommended that the number of sequential read operations be increased above eight when the present invention is applied to FinFET arrays that are fabricated using processes having smaller (e.g., less than 22 nm) minimum features sizes.

According to another aspect of the presently preferred embodiment, prior to performing the write-1 or write-0 operation that precedes each multiple-read sequence, an initial (first) March-type read operation is performed to verify that each FinFET cell stores an opposite logic value (i.e., such that the subsequent write operation, which is performed before the multiple-read operation, changes the logic value stored in each FinFET cell from logic-0 to logic-1 or from logic-1 to logic-0). For example, the initial March-type read operation is used to verify that every FinFET cell is in a "0" logic state (i.e., stores a logic-0 value) before performing the write-1-multiple-read-1 sequence described above, or used to verify that every FinFET cell is in a "1" logic state (i.e., stores a logic-1 value) before performing the write-0-multiple-read-0 sequence described above. Verifying that the opposite logic value is stored in each FinFET cell prior to performing each write-1-multiple-read-1 and write-0-multiple-read-0 sequence provides the added benefit of detecting coupling faults when applying a sequence of operations to one cell (aggressor cell) flips the value of another cell (victim cell).

According to other embodiments, each write-1-multiple-read-1 and write-0-multiple-read-0 sequence is performed while accessing the FinFET cells in either an increasing or decreasing address order. For example, when an increasing address order is utilized, the write-1-multiple-read-1 sequence involves accessing the FinFET cells in an order that starts with the FinFET cell having the lowest address number and ending with the FinFET cell having the highest address number during the March-type write-1 operation, and then accessing the FinFET cells in the increasing address order during each of the subsequent multiple March-type read-1 operations. Accessing the FinFET cells in one of the increasing or decreasing address order during each write-1-multiple-read-1 and write-0-multiple-read-0 sequence provides the added benefit of detecting coupling faults for both cases, first when aggressor cell address is less than victim cell address, and second when aggressor cell address is greater than victim cell address (i.e., applying the test sequence only with increasing or only with decreasing address order may fail to detect coupling faults for the mentioned both cases). In yet another other embodiment, the various test patterns described above are implemented using both increasing and decreasing address orders to provide alternative test processes that can be used to reliably identify faulty FinFET cells in embedded FinFET arrays produced using a wide range of fabrication processes and circuit configurations.

The present invention is also directed to ICs including FinFET memory arrays, and one or more built-in self-test (BIST) circuits that reside on the IC's substrate and are configured to perform the novel FinFET memory testing procedures mentioned above. In one embodiment, each BIST circuit also functions to selectively reconfigure each FinFET memory array according to test results generated by the novel memory testing procedures. For example, if the BIST circuit identifies a faulty FinFET cell in an associated FinFET array by way of performing the novel test procedures, the BIST circuit reconfigures the FinFET array such that a redundant row of FinFET cells is accessed by the IC's functional circuitry during normal operation whenever access to the row containing the faulty FinFET cell is required.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
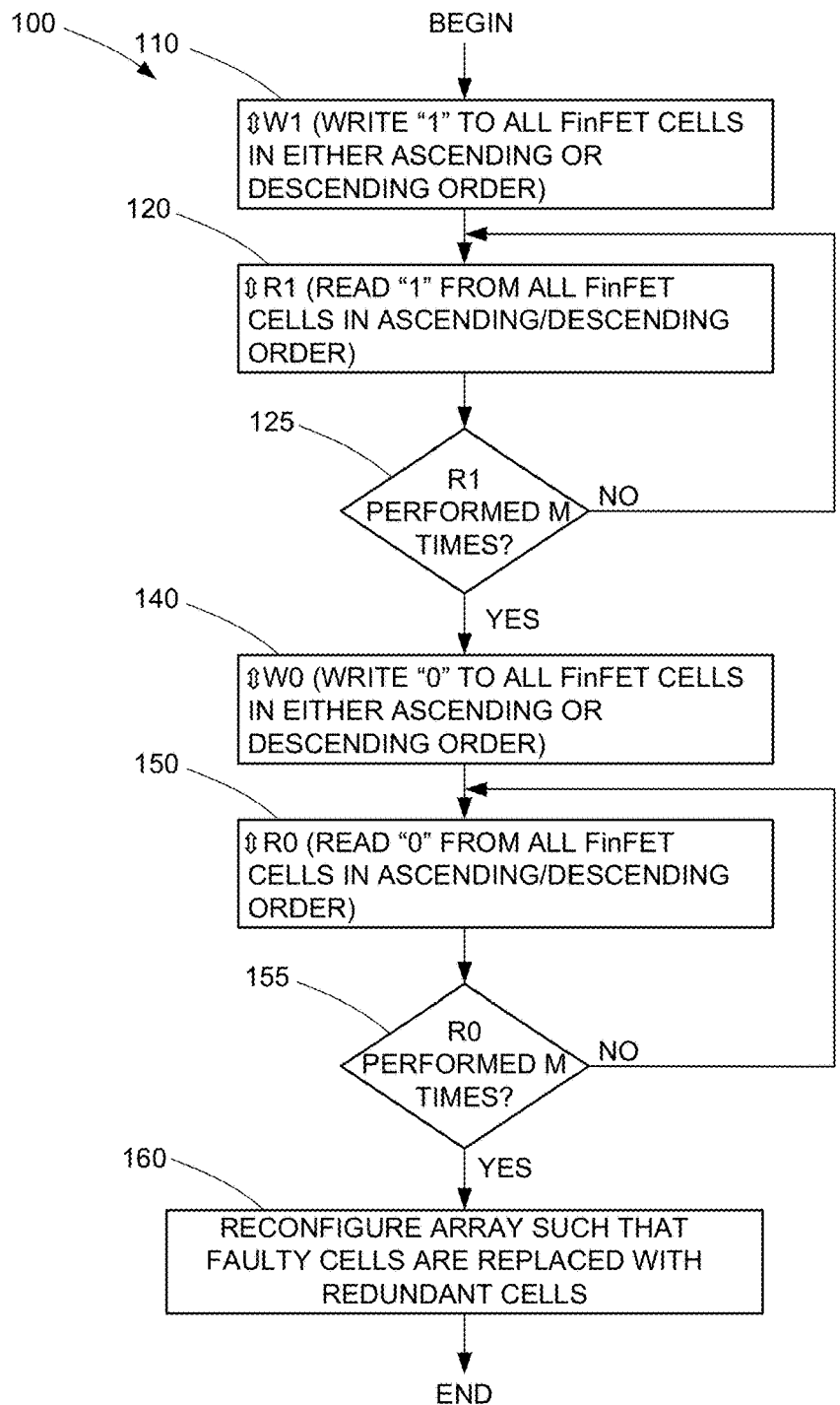
FIG. 1 is a flow diagram depicting method for testing/reconfiguring a FinFET array according to a generalized embodiment of the present invention.

The present invention relates to an improvement in FinFET memory array testing. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The present invention introduces a novel set of particular test patterns developed in the form of March test element sequences that serve as a basis for creating test algorithms for detecting FinFET-specific faults during memory test operations. The novel set of test patterns was developed as a result of study on FinFET technology during which certain static and dynamic faults were recognized that represent the dominant faults occurring in FinFET-based memories. Specifically, the dominant static FinFET faults include Stuck-At Faults (SAF), Transition Faults (TF), Read Destructive Faults (RDF), Deceptive Read Destructive Faults (DRDF), State Coupling Faults (CFst), Read Destructive Coupling Faults (CFrd), Deceptive Read Destructive Coupling Faults (CFdrd), and Read Disturb Coupling Faults (CFdsr), and the dominant dynamic FinFET faults include dynamic Read Destructive Faults (dRDF) requiring up to eight consecutive read operations for sensitization, and dynamic Deceptive Read Destructive Faults (dDRDF) requiring up to eight consecutive read operations for sensitization. While the above-listed static faults are common for both FinFET and planar technologies, the listed dynamic faults are considered FinFET-specific.

The above-mentioned study of FinFET technology involved massive simulations in which defects were introduced into various FinFET-based memories (i.e., FinFET bit-cells fabricated using semiconductor fabrication processes from different foundries and defined by 16 nm, 14 nm, 10 nm, and 7 nm feature sizes memories), and the same defects were injected in planar-based (45 nm, 28 nm) memories for comparison. It was determined that existing test algorithm libraries meant for testing planar-based memories do not detect some of the defects injected in FinFET-based memories (e.g., Fin-related defects, such as Fin-Open and Gate-Fin short). In addition, there were some cases when the same defect was detected by the existing test algorithm library when it is injected in planar-based memories and failed to detect it when it is injected in FinFET-based memories. Based on these experiments, unique test patterns detecting FinFET-specific faults were identified. Hence, the novel set of basic test patterns for detecting FinFET-specific faults that are presented herein were discovered.

Silicon data and the experiments show that FinFET-memories are more prone to dynamic faults requiring multiple (i.e., three or more) consecutive operations to sensitize the faults, while this phenomenon is absent or have very low probability in planar-based memories. Based on a review of the conventional test algorithms, such as March C-, March LR, MATS, MOVI, GALPAT, Walking, March X, March Y, etc., it was determined that none of these conventional test algorithms include a sufficient number of consecutive read operations, and therefore it was concluded that conventional test patterns are not able to detect some of FinFET-specific faults. Moreover, when comparing test results from FinFETs fabricated with smaller minimum feature size processes (e.g., 16 nm, 10 nm and 7 nm), it was noticed that the required number of consecutive read operations required to sensitize certain FinFET-specific faults increases as the minimum feature size becomes smaller. Accordingly, the number of consecutive read operations associated with the multiple-read sequences discussed below is not limited to the exemplary three or eight number discussed below.

Figure 10:
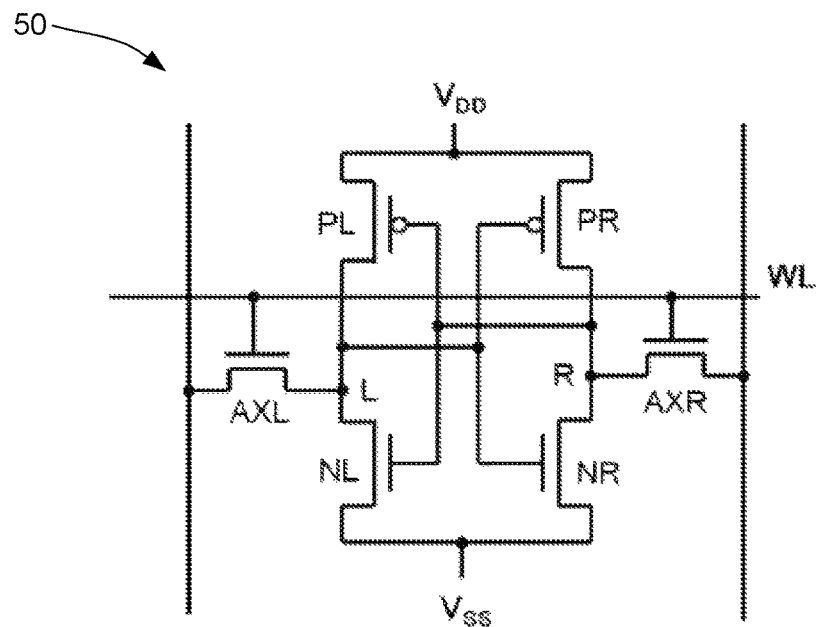
FIG. 10 is a schematic diagram depicting an exemplary FinFET architecture.
Figure 11:
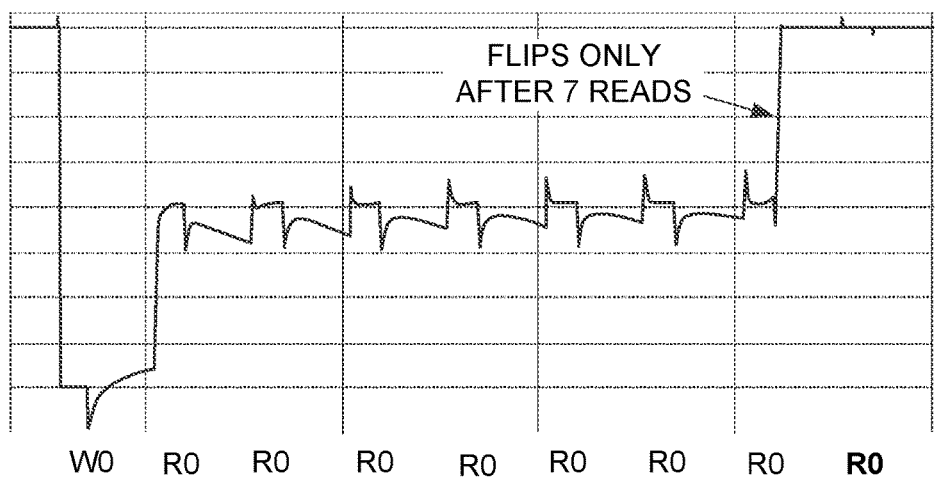
FIG. 11 is a graph depicting an exemplary fault type encountered with the FinFET architecture of FIG. 12.
Figure 12:
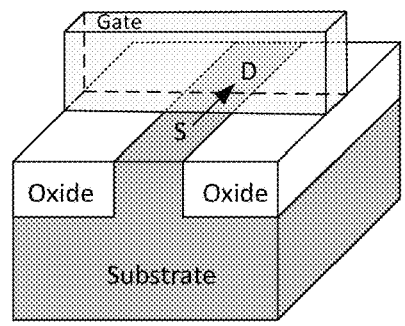
FIG. 12 is a simplified perspective view showing an exemplary conventional planar FET.
Figure 13A:
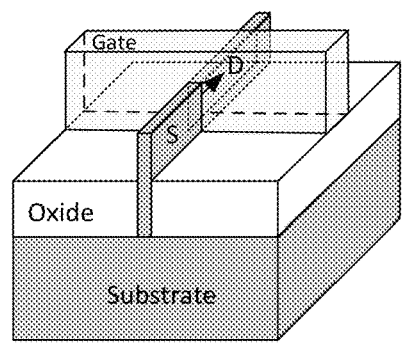
FIGS. 13A and 13B are simplified perspective views showing single-fin and multiple-fin FinFET cells, respectively.
Figure 13B:
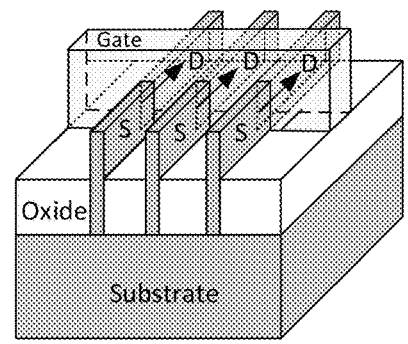

It was also discovered that, in a given FinFET memory array having at least one faulty FinFET cell having a particular dynamic fault that is sensitized by multiple consecutive read-0 operations while not being sensitized by any number of read-1 operations, there often occurs another faulty FinFET cell having a "mirror-image" fault that is sensitized by consecutive read-1 operations while performing read-0 operations without any issue. It was determined that this phenomenon occurs due to the symmetric configuration of FinFET cells—that is, if a defect in a first portion of a FinFET cell can cause a first dynamic fault sensitized by multiple read-0 operations, then a similar defect in a second portion of the FinFET cell that is symmetrical to the first portion can cause a second dynamic fault sensitized by multiple read-1 operations. This "mirror-image" fault concept is illustrated with reference to FIGS. 10 and 11, where FIG. 10 shows an exemplary FinFET cell 50 in schematic form including symmetric access transistors AXL and AXR, symmetric P-type pull-up transistors PL and PR, and symmetric N-type pull-down transistors NL and NR. FIG. 11 shows a signal graph in which the logic value stored on cell 50 is read during consecutively performed read operations. Referring to FIG. 10, a resistive Fin Open defect (dDRDF) flaw occurs in FinFET cell 50 when left-side pull-down transistor NL is fabricated with a certain process-related defect that, as indicated in FIG. 11, is sensitized (i.e., causes cell 50 to erroneously "flip" from storing a logic-0 value to storing a logic-1 value) after several consecutive read-0 operations have been performed. Referring again to FIG. 10, the "mirror-image" fault concept predicts that if a FinFET array includes at least one faulty FinFET cell having the dDRDF flaw described above, then another FinFET cell in the same array may have a similar defect in the right-side pull-down transistor BR, which will result in a similar dDRDF flaw is sensitized after several consecutive read-1 operations have been performed. Accordingly, it is an aspect of the present invention that at least multiple consecutive read-0 operations and multiple consecutive read-1 operations be performed in order to reliably identify all faulty FinFET cells in a given FinFET memory array.

Figure 2:
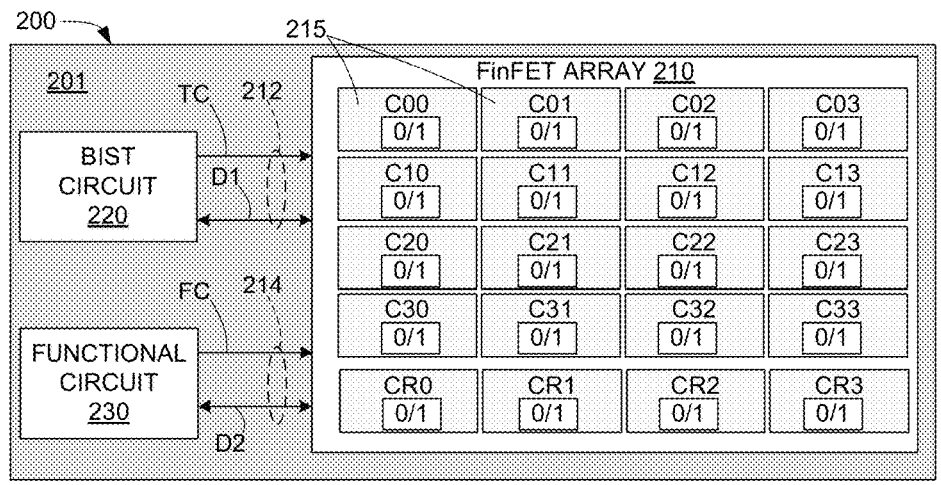
FIG. 2 is a simplified block diagram depicting a FinFET array configured to implement the method of FIG. 1.

FIG. 1 is a flow diagram depicting a method 100 for testing and reconfiguring (if needed) a FinFET array according to a generalized embodiment of the present invention. For reference in the following description of FIG. 1, a simplified IC device 200 is shown in FIG. 2, which includes an embedded FinFET memory array 210, a BIST circuit 220 and functional circuitry 230 fabricated on a semiconductor (e.g., silicon) chip 201. FinFET array 210 includes primary FinFET cells C00 to C33 and redundant FinFET cells CR0 to CR3, where each FinFET cell is configurable to store either a logic-1 or a logic-0 value (indicated by "0/1" in FIG. 2). BIST circuit 220 accesses FinFET array 210 using known techniques by way of a first bus 212 including test command lines TC and data lines D1, and functional circuitry 230 accesses FinFET array 210 using known techniques by way of a second bus 214 including functional command lines FC and data lines D2. Those skilled in the art will recognize that IC device 200 is greatly simplified for brevity, and that the present invention is intended to apply to substantially more complex devices.

Referring again to FIG. 1, method 100 generally includes a test process portion, which is performed in accordance with the processes described below with reference to blocks 110 to 155 and FIGS. 3(A) to 3(D), and a reconfiguration process (block 160). As set forth below, the main thrust of the present invention is the test process, which includes the novel set of basic test patterns for detecting FinFET-specific faults. In one embodiment the test process is performed by way of commands and data transmitted by BIST circuit 220 to FinFET array 210 over bus 212 (see FIG. 2). The reconfiguration process (block 160) is performed, for example, at the end of the test process by BIST circuit 220 using known techniques such that at least one redundant FinFET cell CR0 to CR3 functionally replaces each faulty primary FinFET cell C00 to C33 that is identified during the test process.

Figure 3A:
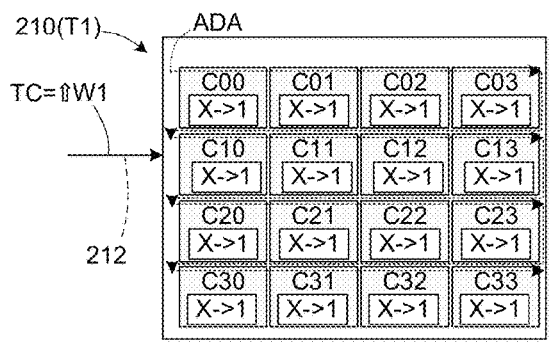
FIGS. 3(A), 3(B), 3(C) and 3(D) are simplified block diagrams depicting an exemplary test operation performed on the simplified FinFET array of FIG. 2 in an increasing address order according to an embodiment of the present invention.
Figure 3B:
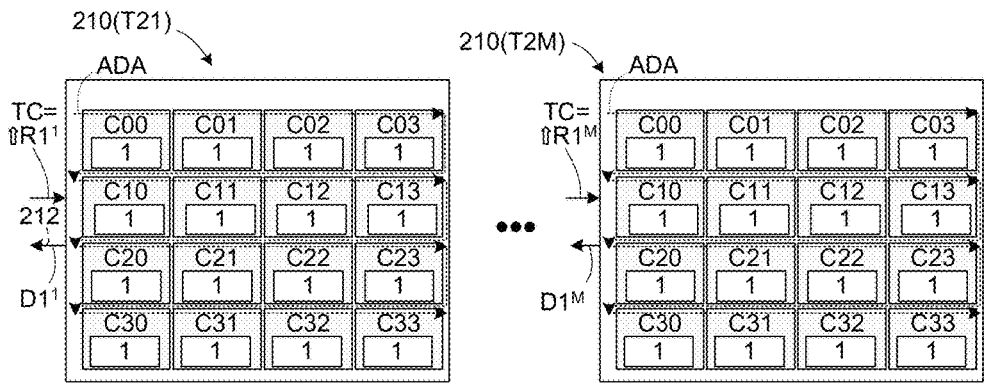
Figure 3C:
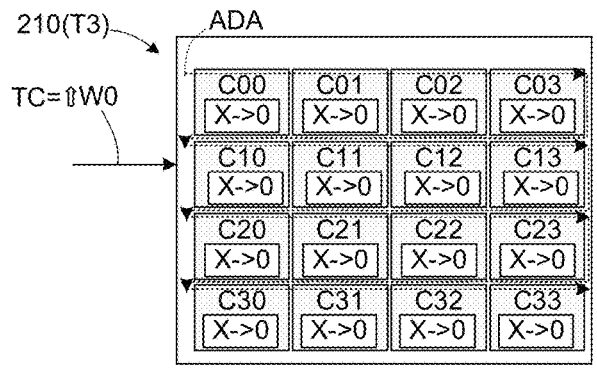
Figure 3D:
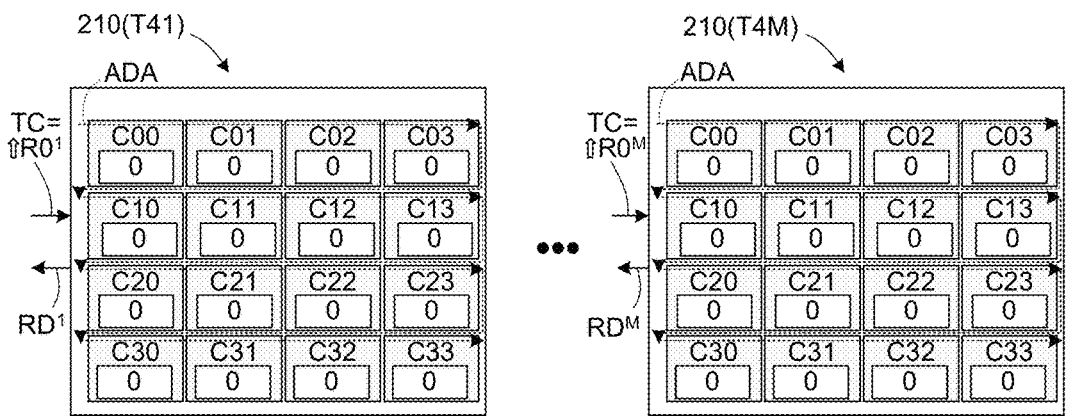

The test process of FIG. 1 is described below with reference to FIGS. 3(A) to 3(D), which include a simplified representation of FinFET array 210 (FIG. 2) for purposes of explaining the March elements (March-type operations) performed in accordance with blocks 110 to 155 of FIG. 1. Specifically, FIG. 3(A) depicts logic values stored in FinFET 210 at a time T1 (denoted "210(T1)" in FIG. 3(A)), FIG. 3(B) depicts logic values stored in FinFET 210 during a time period T21 to T2M that is subsequent to time T1, FIG. 3(C) depicts logic values stored in FinFET 210 at a time T3, and FIG. 3(D) depicts logic values stored in FinFET 210 during a time period T41 to T4M that is subsequent to time T3. Note that FIGS. 3(A) to 3(D) illustrate features associated with a specific implementation of the test process of FIG. 1, and are therefore not intended to be limiting.

Referring to block 110 (FIG. 1), a first part of the test process involves performing a first March-type write operation including sequentially accessing and writing a first logic value (e.g., logic-1) into each FinFET C00 to C33 such that each FinFET cell C00 to C33 is switched to a first programmed state (i.e., stores a logic-1 value). Referring to FinFET array 210(T1), shown in FIG. 3(A), the first March-type write operation involves writing logic-1 data values or otherwise controlling FinFET array 210 by way of a corresponding test command TC transmitted on bus 212 to change the state of each FinFET cell C00 to C33 to logic-1. Note that the notation "X->1" indicates that the stored value in each FinFET cell C00 to C33 is either changed from a logic-0 to a logic-1, or remains at logic-1 (i.e., if logic-1 was stored in the FinFET cell prior to the March-type write operation).

Referring to block 120 (FIG. 1), a second part of the test process involves performing an initial (first) March-type read operation immediately after performing the first March-type write operation (i.e., such that no other March elements are executed between the first March-type write operation and an initial March-type read operation of the first multiple sequential March-type read operations), and then (per block 125) repeating the March-type read operation process multiple (M) times, where "M" is defined as meaning at least three, and more preferably at least eight. Each March-type read operation of this first sequence of multiple March-type read operations involves accessing and reading each FinFET cell C00 to C33 in array 210, and verifying that each FinFET cell C00 to C33 stores the proper logic value (i.e., is in the programmed state established by the first write operation) using known techniques. Referring to FinFET array 210 (T21), shown at the left side of FIG. 3(B), an initial March-type read operation performed at a time T21 involves controlling FinFET array 210 using a proper test control signal TC (i.e., $R1^1$), and reading logic-1 data values $D1^1$ from every cell in FinFET array 210 by way of transmitted on bus 212. A second March-type read operation is then performed immediately after the initial March-type read operation, and each subsequent March-type read operation is performed immediately after a preceding March-type read operation of the first sequence. In this way, the March-type read operation is repeated until, as shown at the right side of FIG. 3(B), a final (Mth) March-type read operation is performed at a time T2M involving reading logic-1 data values $D1^M$ from every cell in FinFET array 210 in response to an associated Mth test control signal TC (i.e., $R1^M$). If any of the FinFET cells C00 to C33 transfers a logic-0 to the BIST circuit during the first multiple sequential March-type read operations, then that FinFET cell is flagged as faulty, and appropriate reconfiguration processing is undertaken or scheduled according to known techniques.

Referring to block 140 (FIG. 1), a third part of the test process involves performing a second March-type write operation including sequentially accessing and writing a second logic value (e.g., logic-0) into each FinFET C00 to C33 such that each FinFET cell C00 to C33 is switched to a second programmed state (i.e., stores a logic-0 value). Referring to FinFET array 210(T3), shown in FIG. 3(C), the second March-type write operation involves writing logic-0 data values or otherwise controlling FinFET array 210 by way of a corresponding test command TC transmitted on bus 212 to change the state of each FinFET cell C00 to C33 to logic-0. Note that the notation "X->0" indicates that the stored value in each FinFET cell C00 to C33 is either changed from a logic-1 (e.g., when time T3 immediately follows time T2M, discussed above), or indicates that the stored value remains at logic-0 (e.g., if logic-0 was stored in the FinFET cell prior to time T3).

Referring to blocks 150 and 155 (FIG. 1), a fourth part of the test process involves performing second multiple sequential March-type read operations (e.g., read-0 operations) immediately after performing the first March-type write operation, with the March-type read-0 operations are repeated M times (per block 155), where "M" is defined as meaning at least three, and more preferably at least eight. As indicated by arrays 210(T41) and 210(T4M) in FIG. 3(D), each March-type read operation of this second sequence of multiple March-type read operations involves accessing and reading each FinFET cell C00 to C33 in array 210, and verifying that each FinFET cell C00 to C33 stores the proper logic value using known techniques. If any of the FinFET cells C00 to C33 transfers a logic-1 to the BIST circuit during the first multiple sequential March-type read operations, then that FinFET cell is flagged as faulty, and appropriate reconfiguration processing is undertaken or scheduled according to known techniques.

Referring to the bottom of FIG. 1, once the test process is completed, the BIST performs the reconfiguration process (block 160) according to known techniques. Suitable BIST circuits that may be modified using techniques known in the art to implement the present invention are disclosed, for example, in U.S. Pat. No. 7,290,186 entitled "METHOD AND APPARATUS FOR A COMMAND BASED BIST FOR TESTING MEMORIES", which is incorporated herein by reference in its entirety.

Figures 4A, 4B:
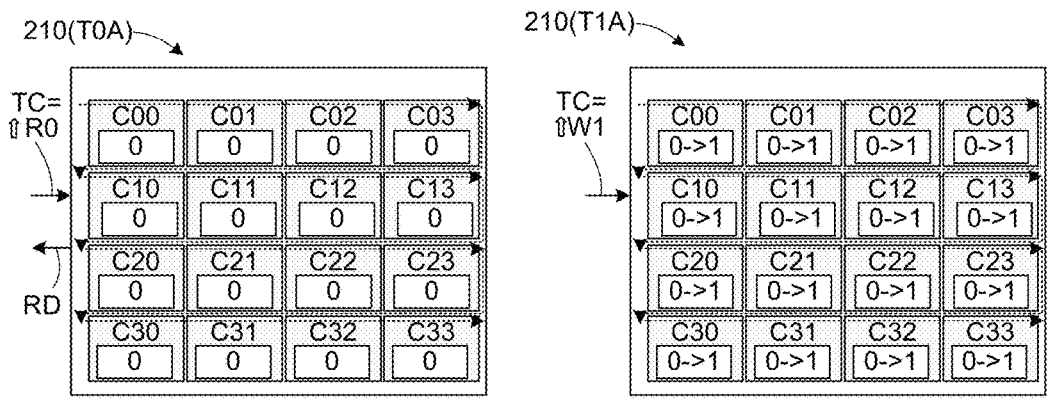
FIGS. 4(A) and 4(B) are simplified block diagrams depicting an optional initial March-type read-0 and write-1 operations performed on the simplified FinFET array of FIG. 2 according to a specific embodiment.
Figure 5A:
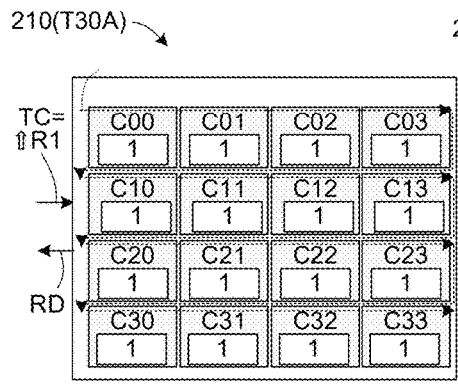
FIGS. 5(A) and 5(B) are simplified block diagrams depicting an optional initial March-type read-1 and write-0 operations performed on the simplified FinFET array of FIG. 2 according to another specific embodiment of the present invention.
Figure 5B:
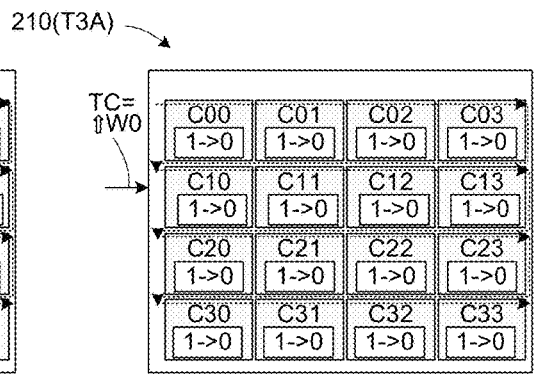

According to a presently preferred embodiment, the generalized approach illustrated in FIG. 1 is further enhanced by way of verifying that opposite logic values are stored in each FinFET cell of FinFET array before the first and second March-type write operations. For example, as illustrated in FIG. 4(A), a first March-type read operation is performed at a time T0A to verify that each FinFET cell C00 to C33 of FinFET array 210 stores the opposite (second) logic value (i.e., logic-0 in the example provided above) immediately before performing, as depicted in FIG. 4(B), the first March-type write operation according to block 110 (FIG. 1). Note that, as depicted in FIG. 4(B), the write operation performed at time T1A involves changing all logic-0 values to logic-1 values. That is, FIG. 4(B) represents a specific case in which the "X" logic value shown in FIG. 3(B) is a logic-0. Similarly, a second March-type read operation is performed at a time T30A as depicted in FIGS. 5(A) to verify that each FinFET cell C00 to C33 stores logic-1 values immediately before performing the second March-type write operation at time T3A, which is depicted in FIG. 5(B) and described above with reference to block 140.

Figure 6A:
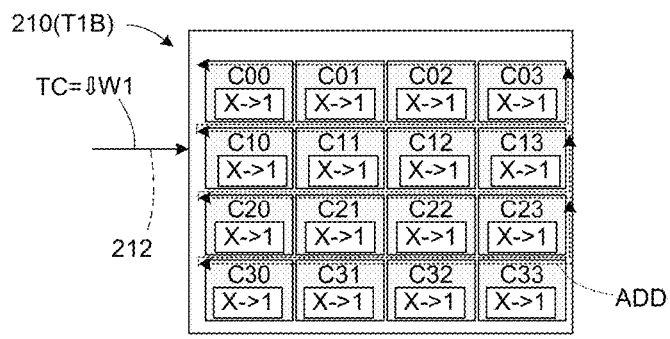
FIGS. 6(A) and 6(B) are simplified block diagrams depicting a partial test operation performed on the simplified FinFET array of FIG. 2 in an decreasing address order according to another exemplary embodiment of the present invention.
Figure 6B:
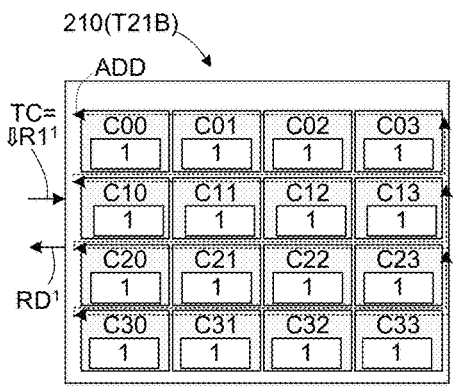
Figure 6B:
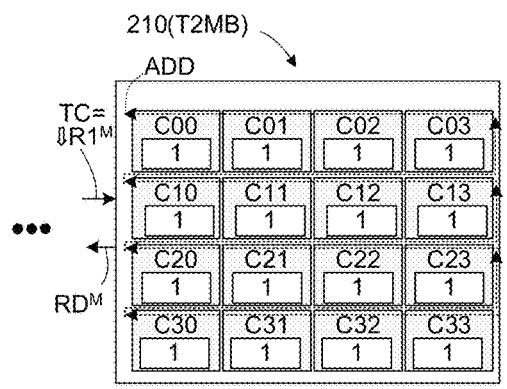

According to another embodiment of the present invention, the test process described above with reference to FIG. 1 is implemented such that first March-type write operation described above with reference to FIG. 3(A) and block 110, the first multiple sequential March-type read operations described above with reference to FIG. 3(B) and blocks 120 and 125, the second March-type write operation described above with reference to FIG. 3(C) and block 140, and the second multiple sequential March-type read operations described above with reference to FIG. 3(D) and blocks 140 and 145 are performed either in an increasing address order or a decreasing address order. For example, in the embodiment depicted in FIGS. 3(A) to 3(D), each of the depicted read and write operations are performed in the increasing address order indicated by dashed-line-arrow ADA, i.e., starting with FinFET cell C00 and ending with FinFET cell C33. In an alternative embodiment, FIGS. 6(A) and 6(B) depict FinFET array 210 at times T1B and T21B to T2MB during write and multiple-read operations, respectively, which are performed essentially as described above with reference to FIGS. 3(A) and 3(B), but in a decreasing address order indicated by dashed-line-arrow ADD, i.e., starting with FinFET cell C33 and ending with FinFET cell C00.

According to another embodiment of the present invention, the test process described above with reference to FIG. 1 is performed twice, once using the increasing address order described above with reference to FIGS. 3(A) to 3(D), and once using the decreasing address order described above with reference to FIGS. 6(A) and 6(B). That is, in addition to the first and second March-type write operations and the first and second multiple March-type read operation sequences performed in the increasing address order described above, the test process includes third and fourth March-type write operations and third and fourth multiple March-type read operation sequences performed in the decreasing address order.

Figure 7:
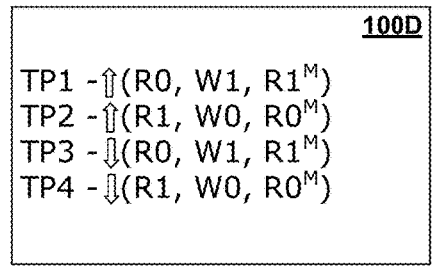
FIG. 7 is a table depicting a set of core test patterns performed during the FinFET array testing method according to an embodiment of the present invention.

FIG. 7 is a table indicating March-type test patterns TP1 to TP4 performed during the FinFET test process described above according to a specific embodiment of the present invention. Specifically, first test pattern TP1 and third test pattern TP3 respectively include performing: a first/third March-type read operation R0 to verify that each FinFET cell of a FinFET array (e.g., cells C00 to C33 of array 210 in FIG. 2) stores a logic-0 value, performing a first/third March-type write operation W1 immediately after the first/third March type read operation to store a logic-1 in each FinFET cell of the FinFET array, and performing a first/third sequence immediately after the first/third write operation including multiple (i.e., "M") sequential March-type read-1 operations $R1^M$. Similarly, second test pattern TP2 and fourth test pattern TP4 respectively include performing: a second/fourth March-type read operation R1 to verify that each FinFET cell of the FinFET array stores a logic-1 value, performing a second/fourth March-type write operation W0 to store a logic-0 in each FinFET cell of the FinFET array, and performing a second/fourth sequence including multiple (i.e., "M") sequential March-type read-0 operations $R1^M$. In this case, the "⇑" symbol in front of first test pattern TP1 and second test pattern TP2 indicates that these test patterns are performed while accessing the FinFET cells using an increasing address order, and the "⇓" symbol in front of third test pattern TP3 and fourth test pattern TP4 indicates that these test patterns are performed while accessing the FinFET cells using a decreasing address order.

Figure 8:
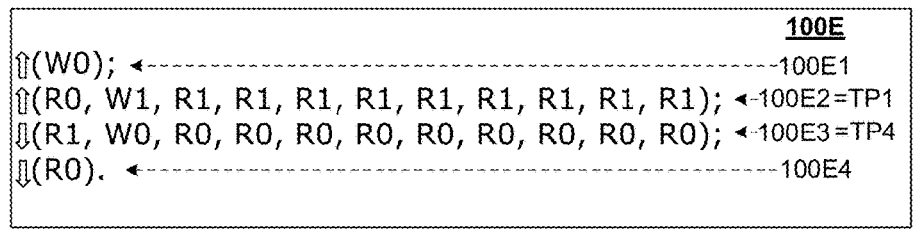
FIG. 8 is a table depicting an exemplary sequence of March-type operations performed during FinFET array testing method according to an exemplary embodiment of the present invention.
Figure 9:
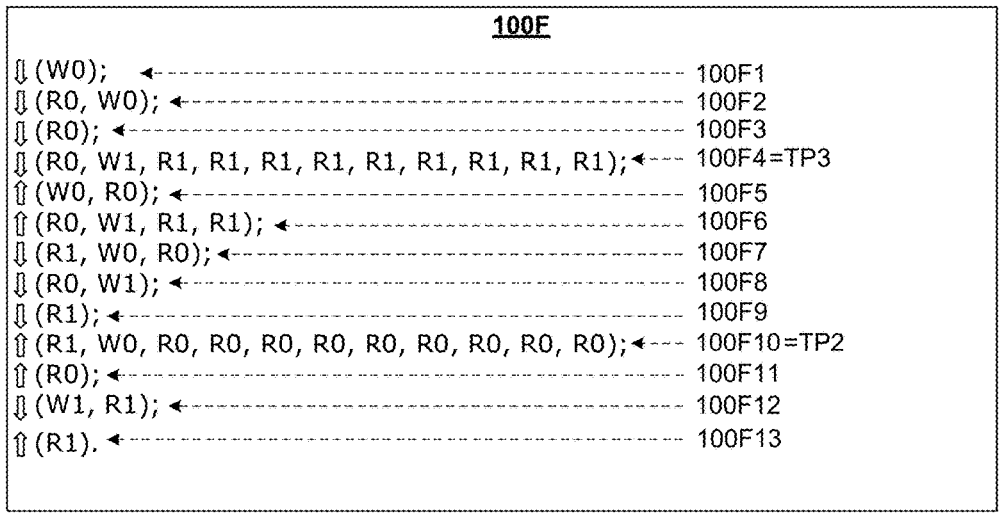
FIG. 9 is a table depicting an exemplary sequence of March-type operations performed during FinFET array testing method according to another exemplary embodiment of the present invention.

FIGS. 8 and 9 include respective tables indicating alternative test processes according to additional specific embodiments of the present invention. FIG. 8 shows a first test process including process lines 100E1 to 100E4, where process lines 100E2 and 100E3 include March-type read and write operations that are consistent with test processes TP1 and TP4, described above. This test process detects all the considered FinFET-specific faults. FIG. 9 shows another test process including process lines 100F1 to 100F13, where process lines 100F4 and 100F10 include March-type read and write operations that are consistent with test processes TP3 and TP2, respectively, which are described above with reference to FIG. 7. This test process diagnoses all the considered static and dynamic faults including FinFET-specific faults, i.e., identifies the fault types.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for testing a FinFET array including a plurality of FinFET cells, each said FinFET cell having an associated array address, the FinFET array being configured such that the associated array addresses of said plurality of FinFET cells are arranged in a sequential address order, the method comprising:
   performing a first March-type write operation including sequentially accessing and writing a first logic value into each of said plurality of FinFETs;
   performing first multiple sequential March-type read operations including sequentially accessing and reading the plurality of FinFET cells a first plurality of times, and verifying that each said FinFET cell stores the first logic value during each of the first multiple sequential March-type read operations;
   performing a second March-type write operation including sequentially accessing and writing a second logic value into each of said plurality of FinFETs; and
   performing second multiple sequential March-type read operations including sequentially accessing and reading the plurality of FinFET cells a second plurality of times, and verifying that each said FinFET cell stores the second logic value during each of the second multiple sequential March-type read operations.

2. The method of claim 1,
wherein performing said first March-type write operation comprises writing a logic-1 value into each of said plurality of FinFETs;
wherein performing said first multiple sequential March-type read operations comprises, immediately after performing the first March-type write operation, sequentially accessing and performing a plurality of March-type read-1 operations;
wherein performing said second March-type write operation comprises writing a logic-0 value into each of said plurality of FinFETs; and
wherein performing said second multiple sequential March-type read operations comprises, immediately after performing the second March-type write operation, sequentially accessing and performing a plurality of March-type read-0 operations.

3. The method of claim 2,
wherein performing the first multiple sequential March-type read operations said first plurality of times comprises sequentially accessing and reading the plurality of FinFET cells at least eight times, and
wherein performing the second multiple sequential March-type read operations said second plurality of times comprises sequentially accessing and reading the plurality of FinFET cells at least eight times.

4. The method of claim 2, further comprising:
performing a first March-type read operation to verify that each said FinFET cell stores the second logic value immediately before performing said first March-type write operation, and
performing a second March-type read operation to verify that each said FinFET cell stores the first logic value immediately before performing said first March-type write operation.

5. The method of claim 4, wherein performing said first March-type write operation, performing each of said first multiple sequential March-type read operations, performing said second March-type write operation, and performing each of said second multiple sequential March-type read operations comprises sequentially accessing the plurality of FinFET cells in one of an increasing address order and a decreasing address order.

6. The method of claim 5,
wherein performing said first March-type write operation, performing each of said first multiple sequential March-type read operations, performing said second March-type write operation, and performing each of said second multiple sequential March-type read operations comprises sequentially accessing the plurality of FinFET cells in said increasing address order, and
wherein the method further comprises:
performing a third March-type write operation including sequentially accessing and writing said first logic value into each of said plurality of FinFETs in a decreasing address order;
performing third multiple sequential March-type read operations including sequentially accessing and reading the plurality of FinFET cells a third plurality of times in the decreasing address order, and verifying that each said FinFET cell stores the first logic value during each of the third multiple sequential March-type read operations;
performing a fourth March-type write operation including sequentially accessing and writing said second logic value into each of said plurality of FinFETs in the decreasing address order; and
performing fourth multiple sequential March-type read operations including sequentially accessing and reading the plurality of FinFET cells a fourth plurality of times in the decreasing address order, and verifying that each said FinFET cell stores the second logic value during each of the second multiple sequential March-type read operations.

7. The method of claim 6,
wherein performing the third multiple sequential March-type read operations said third plurality of times comprises sequentially accessing and reading the plurality of FinFET cells at least eight time, and
wherein performing the fourth multiple sequential March-type read operations said fourth plurality of times comprises sequentially accessing and reading the plurality of FinFET cells at least eight time.

8. The method of claim 7, further comprising:
performing a third March-type read operation to verify that each said FinFET cell stores the second logic value immediately before performing said third March-type write operation, and
performing a fourth March-type read operation to verify that each said FinFET cell stores the first logic value immediately before performing said fourth March-type write operation.

* * * * *